(12) United States Patent
Kim

(10) Patent No.: US 7,492,578 B2
(45) Date of Patent: Feb. 17, 2009

(54) PLASMA DISPLAY PANEL

(75) Inventor: Yeung-Ki Kim, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 173 days.

(21) Appl. No.: 11/440,098

(22) Filed: May 25, 2006

(65) Prior Publication Data

US 2006/0274486 A1    Dec. 7, 2006

(30) Foreign Application Priority Data

Jun. 4, 2005    (KR) .................... 10-2005-0048116

(51) Int. Cl.
*H05K 5/00* (2006.01)
*H05K 7/00* (2006.01)
*G02F 1/1333* (2006.01)
*H01J 5/48* (2006.01)
*H01J 5/50* (2006.01)
*H01J 17/26* (2006.01)
*H01J 61/28* (2006.01)
*H01J 17/49* (2006.01)

(52) U.S. Cl. .................... 361/681; 349/58; 349/60; 313/49

(58) Field of Classification Search ................ 361/681; 349/58–60; 313/231.31, 49, 582
See application file for complete search history.

(56) References Cited

U.S. PATENT DOCUMENTS

| | | | |
|---|---|---|---|
| 5,541,618 A | 7/1996 | Shinoda | |
| 5,661,500 A | 8/1997 | Shinoda et al. | |
| 5,663,741 A | 9/1997 | Kanazawa | |
| 5,674,553 A | 10/1997 | Shinoda et al. | |
| 5,724,054 A | 3/1998 | Shinoda | |
| 5,786,794 A | 7/1998 | Kishi et al. | |
| 5,952,782 A | 9/1999 | Nanto | |
| RE37,444 E | 11/2001 | Kanazawa | |

(Continued)

FOREIGN PATENT DOCUMENTS

JP    2845183    10/1998

(Continued)

OTHER PUBLICATIONS

"*Final Draft International Standard*", Project No. 47C/61988-1/Ed. 1; Plasma Display Panels—Part 1: Terminology and letter symbols, published by International Electrotechnical Commission, IEC. in 2003, and Appendix A—Description of Technology, Annex B—Relationship Between Voltage Terms And Discharge Characteristics; Annex C—Gaps and Annex D—Manufacturing.

(Continued)

*Primary Examiner*—Jayprakash N Gandhi
*Assistant Examiner*—Anthony M Haughton
(74) *Attorney, Agent, or Firm*—Robert E. Bushnell, Esq.

(57) ABSTRACT

A plasma display panel has a plasma display panel assembly for displaying an image, a chassis base coupled to the panel assembly and supporting the panel assembly, and a reinforcing member integrally formed in the chassis base so as to improve the rigidity of the chassis base. The reinforcing member is integrally manufactured with the chassis base. This structure provide improved operation efficiency and lower manufacturing cost, while maintaining the rigidity of the chassis base.

14 Claims, 2 Drawing Sheets

U.S. PATENT DOCUMENTS

| | | | |
|---|---|---|---|
| 6,560,124 B1 * | 5/2003 | Irie et al. ............... | 361/816 |
| 6,630,916 B1 | 10/2003 | Shinoda | |
| 6,688,576 B2 * | 2/2004 | Oishi et al. ............ | 248/317 |
| 6,707,436 B2 | 3/2004 | Setoguchi et al. | |
| 6,813,159 B2 * | 11/2004 | Irie et al. ............... | 361/752 |
| 6,966,617 B2 * | 11/2005 | Chen et al. ............. | 312/7.2 |
| 7,133,281 B2 * | 11/2006 | Bae ....................... | 361/681 |
| 2003/0169573 A1 * | 9/2003 | Irie et al. ............... | 361/752 |
| 2004/0036396 A1 * | 2/2004 | Kang et al. ............ | 313/231.31 |
| 2004/0195969 A1 | 10/2004 | Kim et al. | |
| 2005/0180098 A1 * | 8/2005 | Kim ....................... | 361/681 |
| 2005/0184631 A1 * | 8/2005 | Kim ....................... | 313/45 |
| 2005/0258726 A1 * | 11/2005 | Bang ...................... | 313/49 |
| 2005/0258749 A1 * | 11/2005 | Ahn ....................... | 313/582 |
| 2005/0264982 A1 | 12/2005 | Kim et al. | |
| 2006/0077619 A1 | 4/2006 | Kim et al. | |
| 2006/0082272 A1 | 4/2006 | Kim et al. | |

FOREIGN PATENT DOCUMENTS

| | | |
|---|---|---|
| JP | 2917279 | 4/1999 |
| JP | 2001-043804 | 2/2001 |
| JP | 2001-325888 | 11/2001 |
| KR | 10-2003-0061498 | 3/2003 |

OTHER PUBLICATIONS

*Office Action* from the Korean Intellectual Property Office issued in Applicant's corresponding Korean Patent Application No. 10-2005-0048116 dated May 28, 2008.

* cited by examiner

PLASMA DISPLAY PANEL

CLAIM OF PRIORITY

This application makes reference to, incorporates the same herein, and claims all benefits accruing under 35 U.S.C. § 119 from an application for PLASMA DISPLAY PANEL, earlier filed in the Korean Intellectual Property Office on the 4$^{th}$ of June 2005 and there duly assigned Serial No. 10-2005-0048116.

BACKGROUND OF THE INVENTION

1. Field of the Invention

The present invention relates to a plasma display panel, and more particularly to a plasma display panel in which a chassis base and a reinforcing member are assembled together as a body.

2. Description of the Related Art

A plasma display panel (PDP) is typically constituted with a panel assembly including a front substrate and a rear substrate coupled to the front substrate. An adhesive tape is attached to the rear surface of a panel assembly, and a chassis base is coupled to the panel assembly through the adhesive tape. Heat-dissipating sheets maybe interposed between the panel assembly and the chassis base in order to transmit heat generated by the panel assembly to the chassis base, and thereby to quickly dissipate heat, or prevent the panel assembly from locally generating heat. A variety of circuit substrates are mounted on the back of the chassis base.

A PDP is electrically connected to circuit substrates such as buffer boards by using a signal transmission unit such as a tape carrier package (TCP). A plurality of integrated circuits (ICs) are mounted on a TCP, and the TCP is folded to be installed to reinforce members of the chassis. Cover plates are mounted on the upper portion of circuit devices such as Ics.

Heat is generated by circuit devices of a PDP during operation. Heat dissipates through a chassis base via chassis reinforcing members or heat-dissipating sheets, or directly dissipates through air contacting the upper surface of circuit devices.

In conventional practice, reinforcing members such as brackets may be installed on a chassis base. Brackets and chassis base are separately manufactured, and brackets are installed on a surface of the chassis base using coupling, screw connection or toxing. In this case, additional processes are necessary to separately manufacture a chassis base and brackets, and to couple the brackets into the chassis base, thereby lowering productivity. Moreover, if a chassis base and brackets are incompletely coupled to each other, brackets maybe damaged due to stress applied to their coupling components. It is therefore an object of the present invention to provide an improved plasma display panel.

SUMMARY OF THE INVENTION

The present invention provides a plasma display panel that includes a chassis base and an associated reinforcing member disposed to impart strength and enhance the rigidity of the chassis base. The reinforcing member is integrally manufactured with the chassis base, thereby increasing operation efficiency, reducing manufacturing cost, and providing a lightweight chassis base.

According to an aspect of the present invention, there is provided a plasma display panel including a plasma display panel assembly for displaying various visual images, a chassis base coupled to the panel assembly for supporting the panel assembly, and a reinforcing member integrally formed in the chassis base so as to reinforce the rigidity of the chassis base. The reinforcing member may have a beading member that projects from a rear surface of the chassis base. An engagement hole may be formed in the reinforcing member to connectedly receive an external engagement member. A boss may be formed in the reinforcing member to accommodate engagement.

According to another aspect of the present invention, there is provided a plasma display panel including a plasma display panel assembly for displaying an image, a chassis base including a rib perforated by a plurality of openings, a circuit substrate coupled to the chassis base, and a reinforcing member integrally formed in the chassis base so as to reinforce the rigidity of the chassis base. The reinforcing member may have a beading member that projects from the rear surface of the chassis base. The circuit board may be mounted on the rib.

BRIEF DESCRIPTION OF THE DRAWINGS

A more complete appreciation of the invention and many of the attendant advantages thereof, will be readily apparent as the same becomes better understood by reference to the following detailed description when considered in conjunction with the accompanying drawings in which like reference symbols indicate the same or similar components.

DETAILED DESCRIPTION OF THE INVENTION

Figure 1:
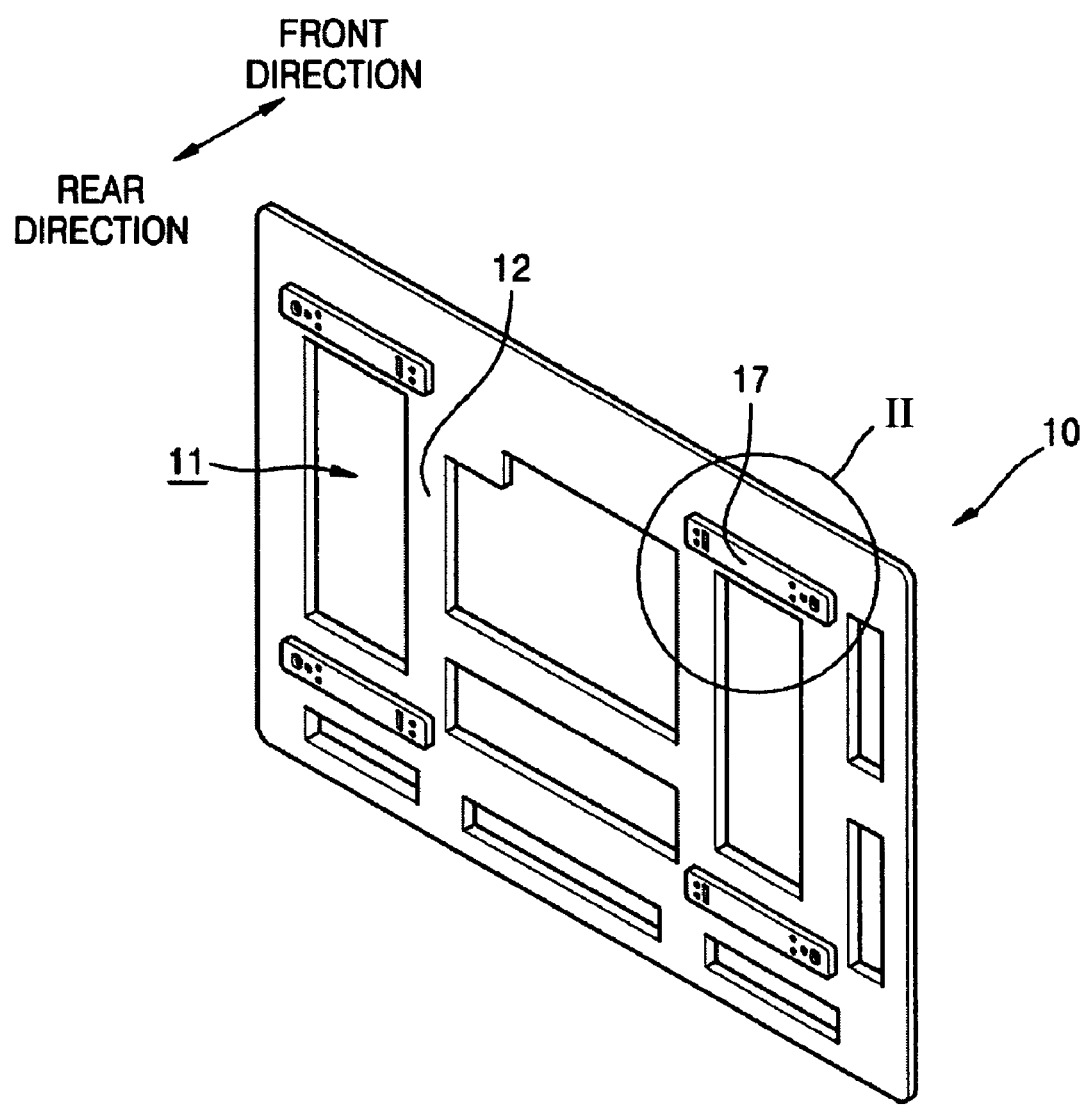
FIG. 1 is a perspective view of a chassis base having a reinforcing member constructed as an embodiment of the present invention.

FIG. 1 is a perspective view of a chassis base 10 constructed as an embodiment of the present invention. Referring to FIG. 1, flat type chassis base 10 is perforated by a plurality of openings 11 having various sizes and shapes. Openings 11 are formed to correspond to the shape of a circuit substrate to be mounted on chassis base 10. The circuit substrate is coupled to openings 11. A portion of the circuit substrate may cover openings 11, or may be disposed inside openings 11. Rib 12 is formed between openings 11 and separates adjacent openings 11. A circuit substrate is mounted on rib 12 via a boss (not shown). While chassis base 10 can be made of aluminum, chassis base 10 is preferably made of plastic materials in order to assure a lightweight plasma display panel. Beading member 17 is coupled to chassis base 10. Beading member 17 functions as a reinforcing member that improves the rigidity of chassis base 10. Beading member 17 may be integrally formed with chassis base 10.

Figure 2:
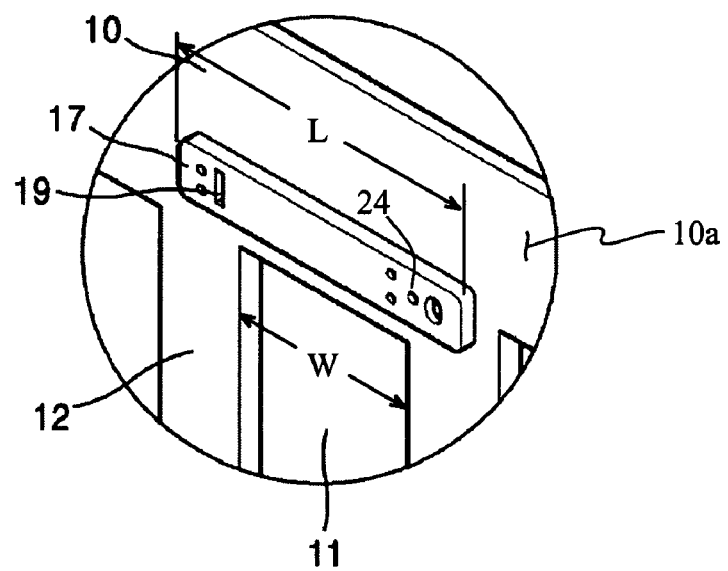
FIG. 2 is an enlarged detailed view of a rear surface of the chassis base indicated by enlargement circle II illustrated in FIG. 1.
Figure 3:
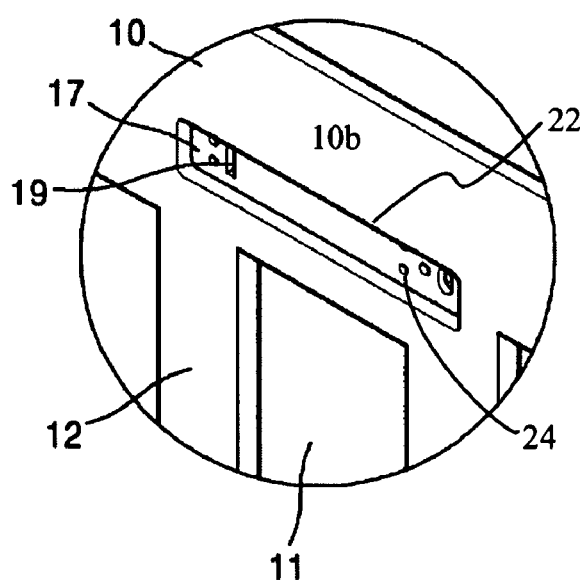
FIG. 3 is an enlarged detailed view of a front surface of the chassis base on the reversed side of enlargement circle II illustrated in FIG. 1.

FIGS. 2 and 3 are enlarged views of beading member 17 viewed in rear and front directions of chassis base 10, respectively. Referring to FIG. 2, beading member 17 projects partially across rear surface 10a (a surface formed in a rear direction) of chassis base 10. Referring to FIG. 3, the underside of beading member 17 is exposed from the front surface 10b (a surface formed in a front direction) of chassis base 10 through a retreated portion 22 of chassis base 10. A plasma display panel assembly for displaying an image is mounted on the front surface of chassis base 10.

Engagement hole 19 is either a circular or slit shape that is formed in beading member 17. Engagement hole 19 is required to enable chassis base 10 to mount and support an external coupling member such as a boss (not shown). Engagement hole 19 may have a variety of shapes, and a plurality of engagement holes may be formed in beading member 17 if desired. Also, boss 24 can be formed in beading member 17 for engagingly receiving a threaded fastener such as a screw. According to the embodiment of the present invention, the rigidity of chassis base 10 is increased by integrating the reinforcing member such as beading member 17 into the structure of chassis base 10. The reinforcing member thereby prevents chassis base 10 from bending.

Chassis base 10 shown in FIGS. 1 through 3 is an example of a chassis base built according to the principles of the present invention. Chassis base 10 shown in FIG. 1 includes a plurality of openings 11 and rib 12 formed between openings 11, but various shapes of chassis bases with reinforcing members could be built according to the principles of the present invention. In this embodiment, beading member 17 is used as a reinforcing member, and is integrally formed with chassis base 10, forming chassis base 10 and beading member 17 into a single body, so that integrally formed beading member 17 greatly improves the rigidity of chassis base 10. As represented in the particular embodiment shown by FIGS. 2 and 3, beading member 17 is sited at a location spaced apart from the closest peripheral edge of opening 11, in an orientation aligned with that peripheral edge. In the particular embodiment shown, the length "L" of beading member 17 along the direction of that orientation is greater than the width "W" of opening 11 along the same direction.

A plasma display panel having chassis base 10 built according to the principles of the present invention would exhibit advantages of improved operational efficiency and lower manufacturing cost, because processes of manufacturing a chassis base and a reinforcing member can be integrated while maintaining the rigidity of the chassis base.

While the present invention has been particularly shown and described with reference to exemplary embodiments thereof, it will be understood by those of ordinary skill in the art that various changes in form and details maybe made therein without departing from the spirit and scope of the present invention as defined by the following claims.

What is claimed is:

1. A plasma display panel, comprising:
   a panel assembly for displaying an image;
   a chassis base having a front surface and a rear surface, the front surface facing the panel assembly, the chassis base having a plurality of openings, one of the openings completely penetrating the chassis base from the front surface to the rear surface, the chassis base including a rib formed between two of the openings, the chassis base coupled to the panel assembly for supporting the panel assembly; and
   a reinforcing member integrally formed in the chassis base so as to reinforce the rigidity of the chassis base, the reinforcing member including a beading member projecting from the rear surface of the chassis base, the beading member being exposed from the front surface of the chassis base and being retreated from the front surface; and the reinforcing member whose length is greater than the length of the opening located closest to the reinforcing member along the direction of the length of the reinforcing member.

2. The plasma display panel of claim 1, comprised of the reinforcing member having an engagement hole to be coupled to an external engagement member.

3. The plasma display panel of claim 1, comprised of the reinforcing member having a boss for engagingly receiving a threaded fastener.

4. The plasma display panel of claim 1, comprised of the chassis base made of a plastic material.

5. The plasma display panel of claim 1, comprised of the reinforcing member formed at a location spaced apart from the peripheral edges of the openings.

6. A plasma display panel, comprising:
   a panel assembly for displaying an image;
   a chassis base having a front surface and a rear surface, the front surface facing the panel assembly, the chassis base having a plurality of openings, one of the openings completely penetrating the chassis base from the front surface to the rear surface, the chassis base including a rib formed between two of the openings, the chassis base coupled to the panel assembly for supporting the panel assembly;
   a circuit substrate covering one of the openings; and
   a reinforcing member integrally formed in the chassis base so as to reinforce the rigidity of the chassis base, the reinforcing member including a beading member projecting from the rear surface of the chassis base; and the reinforcing member whose length is greater than the length of the opening located closest to the reinforcing member along the direction of the length of the reinforcing member.

7. The plasma display panel of claim 6, comprised of the reinforcing member having an engagement hole to be coupled to an external engagement member.

8. The plasma display panel of claim 6, comprised of the reinforcing member having a boss for engagingly receiving a threaded fastener.

9. The plasma display panel of claim 6, comprised of the chassis base made of a plastic material.

10. The plasma display panel of claim 6, comprised of the circuit substrate being mounted on the rib.

11. The plasma display panel of claim 6, comprised of the circuit substrate being coupled to at least one of the openings.

12. A plasma display panel, comprising:
    a panel assembly for displaying an image;
    a chassis base having a front surface and a rear surface, the front surface facing the panel assembly, the chassis base having a plurality of openings, one of the openings completely penetrating the chassis base from the front surface to the rear surface, the chassis base including a rib formed between two of the openings, the chassis base coupled to the panel assembly for supporting the panel assembly; and
    a circuit substrate being disposed inside one of the openings; and a reinforcing member integrally formed in the chassis base so as to reinforce the rigidity of the chassis base, wherein the reinforcing member whose length is greater than the length of the opening located closest to the reinforcing member along the direction of the length of the reinforcing member.

13. The plasma display panel of claim 12, comprised of the reinforcing member including a beading member projecting from a rear surface of the chassis base.

14. The plasma display panel of claim 12, comprised of the reinforcing member disposed at a location spaced apart from the peripheral edges of the openings.

* * * * *